US010410339B2

(12) United States Patent
Ohnuki et al.

(10) Patent No.: US 10,410,339 B2
(45) Date of Patent: *Sep. 10, 2019

(54) SIMULATOR, SIMULATION METHOD, AND SIMULATION PROGRAM

(71) Applicant: OMRON Corporation, Kyoto-shi, Kyoto (JP)

(72) Inventors: Katsushige Ohnuki, Kyoto (JP); Yasunori Sakaguchi, Takatsuki (JP); Haruna Shimakawa, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 291 days.

This patent is subject to a terminal disclaimer.

(21) Appl. No.: 15/366,846

(22) Filed: Dec. 1, 2016

(65) Prior Publication Data

US 2017/0236262 A1 Aug. 17, 2017

(30) Foreign Application Priority Data

Nov. 18, 2015 (JP) .................................. 2015-225785

(51) Int. Cl.
*G06T 7/00* (2017.01)
*G06T 7/73* (2017.01)
(Continued)

(52) U.S. Cl.
CPC ........ *G06T 7/001* (2013.01); *G05B 19/41885* (2013.01); *G06F 17/5009* (2013.01);
(Continued)

(58) Field of Classification Search
None
See application file for complete search history.

(56) References Cited

U.S. PATENT DOCUMENTS 7,881,917 B2 * 2/2011 Nagatsuka ............. B25J 9/1671
  703/6
8,589,122 B2 * 11/2013 Nagatsuka ......... G05B 19/4069
  703/1
(Continued)

FOREIGN PATENT DOCUMENTS

CN  101710235 A  5/2010
CN  101726722 A  6/2010
(Continued)

OTHER PUBLICATIONS

Extended European search report dated May 4, 2017 in the counterpart European patent application.
(Continued)

*Primary Examiner* — Michael Lebentritt
(74) *Attorney, Agent, or Firm* — Metroplex IP Law Group, PLLC

(57) ABSTRACT

The system behavior is evaluated by checking the position and the orientation of a target processed by a processing device in accordance with a control instruction. A simulator estimates a behavior of a system including a processing device that processes a target. The simulator includes a measurement unit that performs image measurement of an input image including at least a part of a target as a subject of the image, an execution unit that executes a control operation for generating a control instruction directed to the processing device based on a measurement result obtained by the measurement unit, and a reproduction unit that reproduces, in the system, a behavior of a target detected in the input image together with information about a type and an orientation of the target based on time-series data for the control instruction output from the execution unit and the measurement result from the measurement unit.

20 Claims, 15 Drawing Sheets

(51) Int. Cl.
  *G05B 19/418* (2006.01)
  *G06K 9/52* (2006.01)
  *G06K 9/62* (2006.01)
  *G06T 17/00* (2006.01)
  *G06F 17/50* (2006.01)

(52) U.S. Cl.
  CPC ............ *G06K 9/52* (2013.01); *G06K 9/6215* (2013.01); *G06K 9/6253* (2013.01); *G06K 9/6254* (2013.01); *G06T 7/0004* (2013.01); *G06T 7/74* (2017.01); *G06T 17/00* (2013.01); *G05B 2219/32357* (2013.01); *G05B 2219/33286* (2013.01); *G06K 2209/19* (2013.01); *G06T 2207/10028* (2013.01); *G06T 2207/30164* (2013.01)

(56) References Cited

U.S. PATENT DOCUMENTS

| | | | |
|---|---|---|---|
| 2007/0282485 A1 | 12/2007 | Nagatsuka et al. | |
| 2007/0299642 A1* | 12/2007 | Kondo | G06F 17/5009 703/6 |
| 2010/0106297 A1 | 4/2010 | Inazumi et al. | |
| 2012/0229620 A1 | 9/2012 | Ikeda et al. | |
| 2012/0236140 A1 | 9/2012 | Hazeyama et al. | |
| 2013/0335405 A1* | 12/2013 | Scavezze | G06T 19/20 345/419 |
| 2014/0088949 A1* | 3/2014 | Moriya | G05B 17/02 703/22 |
| 2014/0214375 A1 | 7/2014 | Kawahito | |
| 2015/0161808 A1* | 6/2015 | Oya | G05B 19/0426 345/633 |
| 2015/0202776 A1 | 7/2015 | Atohira et al. | |
| 2015/0269439 A1 | 9/2015 | Versace et al. | |
| 2017/0139407 A1* | 5/2017 | Sakaguchi | G05B 19/41885 |
| 2017/0140521 A1* | 5/2017 | Sakaguchi | G06K 9/00335 |
| 2017/0323449 A1* | 11/2017 | Aonuma | G06T 19/006 |
| 2018/0088207 A1* | 3/2018 | Feil | G01S 1/70 |

FOREIGN PATENT DOCUMENTS

| | | |
|---|---|---|
| CN | 102674072 A | 9/2012 |
| CN | 103970594 A | 8/2014 |
| EP | 1864764 A2 | 12/2007 |
| JP | 2012-187651 A | 10/2012 |
| JP | 2013-191128 A | 9/2013 |
| JP | 2015-136770 A | 7/2015 |
| KR | 10-1379211 B1 | 4/2014 |

OTHER PUBLICATIONS

Office action dated Nov. 1, 2018 in a counterpart Chinese patent application.

* cited by examiner

SIMULATOR, SIMULATION METHOD, AND SIMULATION PROGRAM

CROSS-REFERENCES TO RELATED APPLICATIONS

This application claims priority to Japanese Patent Application No. 2015-225785 filed Nov. 18, 2015, the entire contents of which are incorporated herein by reference.

FIELD

The present invention relates to a simulator, a simulation method, and a simulation program for estimating the behavior of a system.

BACKGROUND

In the field of factory automation (FA), automatic control techniques using visual sensors are used widely. Such techniques include automatic processing in which an image of a target such as a workpiece is captured, the captured image undergoes image measurement such as pattern matching, and various control devices operate based on the measurement results.

For example, Japanese Unexamined Patent Application Publication No. 2012-187651 (Patent Literature 1) describes conveyor tracking involving a visual sensor and a robot. A system for such conveyor tracking includes the visual sensor and a robot controller for controlling the robot connected to each other with a network.

Designing or examining the system to be controlled with the above automatic control technique may need preliminary evaluation of the performance of the entire system. In response to this, a technique has been developed for virtually creating a system and simulating its operation. For example, Japanese Unexamined Patent Application Publication No. 2013-191128 (Patent Literature 2) describes a technique for integrated simulations of a mechanical system including a visual sensor in a real space corresponding to a virtual imaging unit. With the technique described in Patent Literature 2, a 3D simulator and a visual sensor simulator cooperate with each other to virtually generate captured images of a workpiece in a 3D space at predetermined timings.

CITATION LIST

Patent Literature

Patent Literature 1: Japanese Unexamined Patent Application Publication No. 2012-187651
Patent Literature 2: Japanese Unexamined Patent Application Publication No. 2013-191128

SUMMARY

Technical Problem

For example, the conveyor tracking system described in Patent Literature 1 generates a control instruction to each device based on measurement results transmitted from the visual sensor. When this system is simulated, checking the measurement results from the visual sensor may be intended, together with checking of the behavior of each device.

When, for example, the conveyor tracking system transfers a workpiece on one conveyor onto another, each workpiece may be oriented in a predetermined direction. In this case, checking whether each workpiece has been processed correctly may be performed.

Solution to Problem

A simulator according to one aspect of the present invention estimates a behavior of a system including a processing device for processing a target. The simulator includes a creating unit, a measurement unit, an execution unit, and a reproduction unit. The creating unit virtually creates the system in a three-dimensional virtual space. The measurement unit performs image measurement of an input image including at least a part of a target as a subject of the image in a manner associated with a first area predefined at a predetermined position in the three-dimensional virtual space. The image measurement includes searching the input image for a part corresponding to one or more pieces of predetermined reference information. The execution unit executes a control operation for generating a control instruction directed to the processing device based on a measurement result obtained by the measurement unit. The reproduction unit reproduces, in the system, a behavior of a target detected in the input image together with information about a type and an orientation of the detected target based on time-series data for the control instruction output from the execution unit and the measurement result obtained by the measurement unit.

In some embodiments, the type of the target includes information indicating, among the pieces of predetermined reference information, the most probable degree of correspondence with the target.

In some embodiments, the type of the target includes information indicating whether a degree of correspondence between the target and the pieces of predetermined reference information satisfies a predetermined condition.

In some embodiments, the reproduction unit displays the target using at least one of a color, a shape, or a size that differ depending on the type of the target.

In some embodiments, the simulator further includes an input unit that receives a setting of at least one of the color, the shape, or the size that differ depending on the type of the target.

In some embodiments, the measurement unit outputs, as the measurement result, a rotation angle of a part corresponding to at least one of the pieces of reference information included in the input image, and the reproduction unit generates information about the orientation of the target based on the rotation angle output as the measurement result.

In some embodiments, the reproduction unit displays, in addition to the target, an object indicating the orientation of the target.

In some embodiments, the reproduction unit displays a feature added to an appearance of the reproduced target in a manner associated with the orientation of the target.

In some embodiments, the system includes a carrier configured to transport the target, and the predetermined position is on a transporting path of the carrier.

In some embodiments, the reproduction unit sequentially updates a display position of the target in the three-dimensional virtual space based on information indicating a position or a displacement of the carrier that transports the target.

A simulation method according to another aspect of the present invention is implemented by a computer for estimating a behavior of a system. The system includes a processing device for processing a target. The method includes a creating process, a measurement process, a simulation execution process, and a reproduction process. The creating process includes virtually creating the system in a three-dimensional virtual space. The measurement process includes performing image measurement of an input image including at least a part of a target as a subject of the image in a manner associated with a first area predefined at a predetermined position in the three-dimensional virtual space. The image measurement includes searching the input image for a part corresponding to one or more pieces of predetermined reference information. The simulation execution process includes executing a control operation for generating a control instruction directed to the processing device based on a measurement result from the image measurement. The reproduction process reproduces, in the system, a behavior of a target detected in the input image together with information about a type and an orientation of the detected target based on time-series data for the control instruction and the measurement result.

A simulation program according to another aspect of the present invention is used to estimate a behavior of a system. The system includes a processing device for processing a target. The simulation program causes a computer to implement a creating process, a measurement process, a simulation execution process, and a reproduction process. The creating process includes virtually creating the system in a three-dimensional virtual space. The measurement process includes performing image measurement of an input image including at least a part of a target as a subject of the image in a manner associated with a first area predefined at a predetermined position in the three-dimensional virtual space. The image measurement includes searching the input image for a part corresponding to one or more pieces of predetermined reference information. The simulation execution process includes executing a control operation for generating a control instruction directed to the processing device based on a measurement result from the image measurement. The reproduction process includes reproducing, in the system, a behavior of a target detected in the input image together with information about a type and an orientation of the detected target based on time-series data for the control instruction and the measurement result.

Advantageous Effects

Embodiments of the present invention allow evaluation of the behavior of a system by checking both the position and the orientation of a target processed by a processing device in accordance with a control instruction, and thus allow the validity of the system to be determined readily.

DETAILED DESCRIPTION

Figure 1:
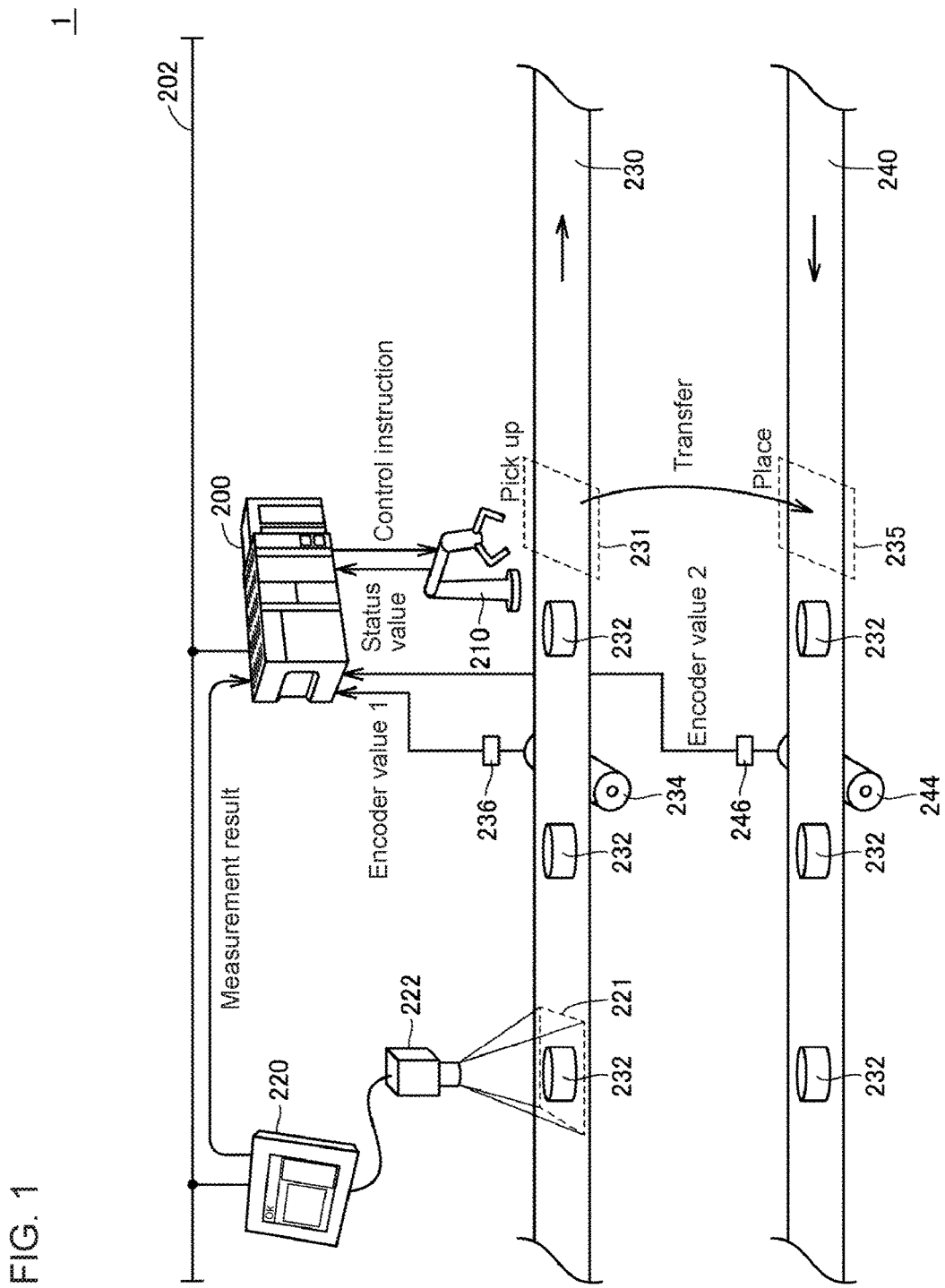
FIG. 1 is a schematic diagram showing the configuration of a system to be simulated by a simulator according to one embodiment.

Embodiments of the present invention will now be described in detail with reference to the drawings. The same or corresponding components in the figures are given the same reference numerals, and will not be described redundantly.

A. Overview

A simulator according to the present embodiment estimates the behavior of a system. More specifically, the simulator according to the present embodiment can estimate the behavior or other acts of a virtually created system using an input image. Although the simulator simulates a system including a processing device that processes targets transported on a transporting path in the embodiment described below, the simulator may simulate any other system.

In the present embodiment, one or more conveyors function as a carrier for transporting targets on a transporting path, and one or more robots function as the processing device for processing the targets. The carrier and the processing device are not limited to these examples and may be selected as appropriate depending on the system to be simulated. The targets may hereafter also be referred to as workpieces. A workpiece may be any item that can be measured by a visual sensor, such as an end product or its part, or an intermediate product or its part.

The simulation performed by the simulator according to the present embodiment will now be described briefly.

FIG. 1 is a schematic diagram showing the configuration of a system to be simulated by the simulator according to the present embodiment. As shown in FIG. 1, for example, a conveyor tracking system 1 includes a robot 210, which picks up a workpiece 232 within a predetermined tracking area 231 when the workpiece 232 transported continuously on a conveyor 230 reaches the tracking area 231, and transfers to and places the workpiece 232 onto a conveyor 240. This series of actions performed by the robot 210, or picking, transferring, and placing, may be referred to as the pick-and-place operation. In the pick-and-place operation, the robot 210 may rotate the workpiece 232 picked up from the conveyor 230 and orient the workpiece in a predetermined direction.

To enable the pick-and-place operation of the robot 210, an imaging unit 222 captures an image of an imaging area 221 defined on a part of the conveyor 230, and a visual sensor 220 performs image measurement including pattern matching of the input image captured by the imaging unit 222 and obtains the measurement results including information about the position, type, orientation, and other parameters of the workpiece 232.

A controller 200 executes a predetermined control logic based on the measurement result obtained by the visual sensor 220 to sequentially update (or track) the position of the workpiece 232 and generate a control instruction for the robot 210. The controller 200 typically includes a programmable logic controller (PLC).

To generate the control instruction for the robot 210, the controller 200 refers to the status value of the robot 210, and an encoder value provided from an encoder 236, which is connected to a drive roller 234 for driving the conveyor 230 (encoder value 1), and an encoder value from an encoder 246 coupled to a drive roller 244 for driving the conveyor 240 (encoder value 2). The controller 200 and the visual sensor 220 are connected to each other with a network 202 to allow data communication between them. The measurement results are transmitted from the visual sensor 220 to the controller 200 through the network 202.

Evaluating the processing capability (e.g., a tact time) and the accuracy of processing may be intended before the conveyor tracking system 1 shown in FIG. 1 is installed. This is because actually installing the conveyor tracking system 1 and checking the processing capability is often difficult due to the cost or time constraints. The simulator according to the present embodiment is designed to achieve simpler estimation of the behavior of the conveyor tracking system 1.

More specifically, the simulator according to the present embodiment virtually creates a system to be simulated in a three-dimensional virtual space, and combines the virtually created system with any input image to achieve more efficient simulation.

Figure 2:
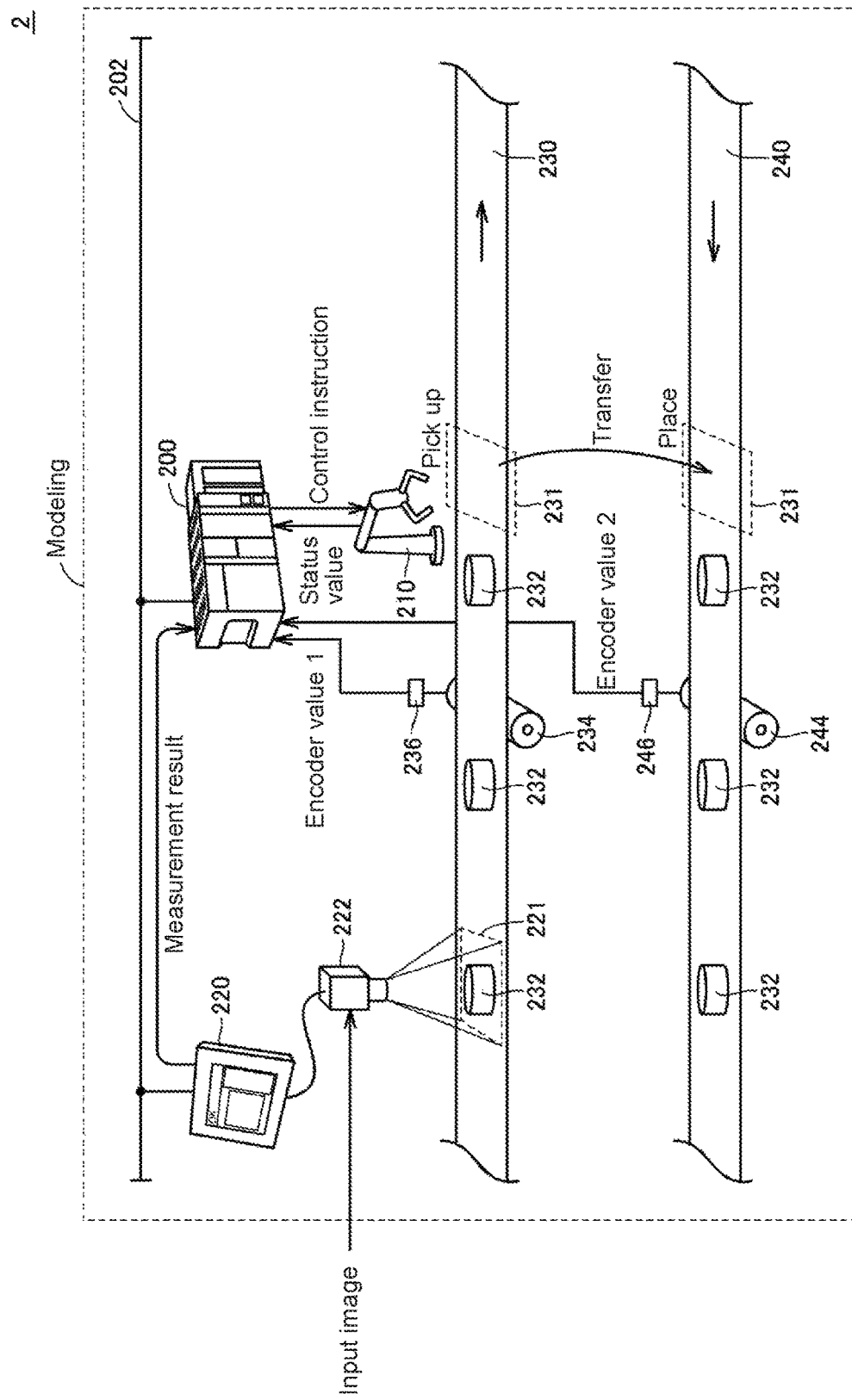
FIG. 2 is a schematic diagram describing a simulation method implemented by the simulator according to the embodiment.

FIG. 2 is a schematic diagram describing a simulation method implemented by the simulator according to the present embodiment. With reference to FIG. 2, the simulator models the entire conveyor tracking system 2, which is to be simulated, and incorporates an input image into this system model to simulate an image-capturing operation performed by the imaging unit 222.

The input image incorporated into the system model of the conveyor tracking system 2 can represent specifications expected in the design (e.g., the moving speed of a workpiece 232 or the number of workpieces 232 passing per unit time). Typically, the input image may be an image actually captured on a similar production line.

Although the input image used in the simulation is expected to be an image captured in the existing system (e.g., the system before update when an updated system is to be simulated), the input image may be captured in any system and situation. More specifically, the input image may be any image including chronological change information about a target to be simulated (typically, a workpiece 232).

The input image may be moving image data or data representing a plurality of still images arranged chronologically. The reproduction speed of the moving image data or the update frequency of the data representing the still images can be adjusted as appropriate to adjust the chronological changes (or the moving speed) of a target to be controlled. Adjusting the input image incorporated in the system model in this manner allows the simulation to yield an optimal value for the chronological changes of the control target.

Additionally, still images that are not actually captured sequentially but are captured in different situations may be arranged as chronologically changing images and used as an input moving image. Although the images generated in this case have no workpiece overlapping, this causes substantially no problem in performing the simulation.

Simulating this system including the visual sensor may involve evaluating the workpiece measurement results obtained from the visual sensor and the behavior of the controller based on the measurement results. More specifically, the pick-and-place operation described above may involve evaluation to determine whether the image measurement for the input image yields correct information about the workpiece (e.g., the type of the workpiece), or whether the workpiece is oriented in an intended direction through the pick-and-place operation performed by the robot.

A simulator 100 according to the present embodiment can represent, in the system, information about the type of the workpiece determined in the image measurement and the orientation and the behavior of the workpiece. The simulator 100 according to the present embodiment will now be described in detail.

B. Hardware Configuration of Simulator

The hardware configuration of the simulator 100 according to the present embodiment will now be described. The simulator 100 according to the embodiment is implemented typically by one or more computers executing a program.

Figure 3:
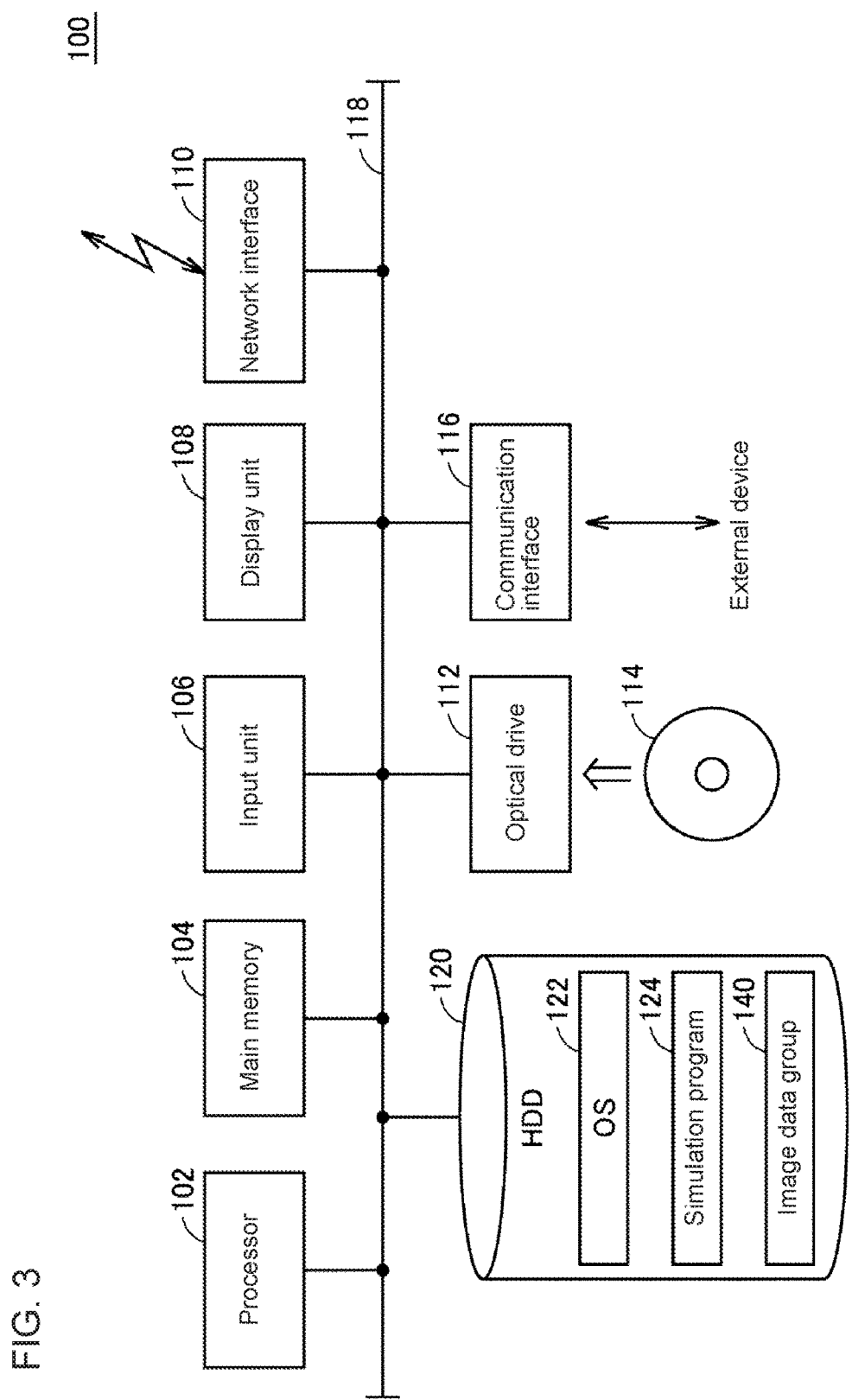
FIG. 3 is a schematic diagram showing the hardware configuration of the simulator according to the embodiment.

FIG. 3 is a schematic diagram showing the hardware configuration of the simulator 100 according to the present embodiment. With reference to FIG. 3, the simulator 100 is, for example, a computer having the general-purpose computer architecture. The simulator 100 includes a processor 102, a main memory 104, an input unit 106, a display unit 108, a network interface 110, a hard disk drive (HDD) 120, an optical drive 112, and a communication interface 116. These components are connected to each other with an internal bus 118 in a communicable manner.

The processor 102 loads a program stored in the hard disk drive 120 into the main memory 104 and executes the program to implement the functions and the processing described later. The main memory 104 is a volatile memory and functions as a working memory used for program execution by the processor 102.

The input unit 106 typically includes a keyboard, a mouse, a touch panel, and a touchpad, and receives a user operation. The display unit 108 includes a display and an indicator, and presents various pieces of information to a user.

The network interface 110 exchanges data with external devices such as a server through a network. The optical drive 112 reads various programs from an optical disc 114 or other media, and installs the programs into the hard disk drive 120. The communication interface 116 is, for example, a universal serial bus (USB) communication interface, and exchanges data with external devices such as an auxiliary storage through local communications.

The hard disk drive 120 stores an operating system (OS) 122, a program for providing the functions of the simulator, such as a simulation program 124, and an image data group 140 including preliminarily obtained input images used for simulation.

Although an intended program is installed in the simulator 100 via the optical drive 112 in the configuration example shown in FIG. 3, a program may be downloaded from a server or other devices on the network.

When the simulator is a general-purpose computer as described above, an OS may be installed on the computer to provide the basic function of the computer, in addition to a program for providing the functions according to the present embodiment. In this case, the simulation program according to the present embodiment may call program modules included in the OS in a predetermined order and/or at predetermined timings as appropriate to perform processing. More specifically, the program according to the present embodiment may not include these program modules and may cooperate with the OS to perform processing. The program according to the present embodiment may not include such modules.

The program according to the present embodiment may be incorporated as a part of another program to be combined. The program according to the present embodiment may not thus include modules of the program to be combined, and may cooperate with the program to achieve processing. In other words, the simulation program according to the present embodiment may be incorporated in the other program.

Although FIG. 3 shows the simulator 100 that is a general-purpose computer, the simulator 100 may be partly or entirely implemented using a dedicated circuit (e.g., an application specific integrated circuit, or ASIC). Additionally, an external device may perform a part of the processing of the simulator 100.

Although the simulator 100 according to the present embodiment shown in FIG. 3 is a single device, two or more devices cooperating with each other may function as the simulator 100. The simulator 100 according to the present embodiment may include a system combining two or more separate devices.

C. Functional Structure of Simulator

The functional structure of the simulator 100 according to the present embodiment will now be described.

Figure 4:
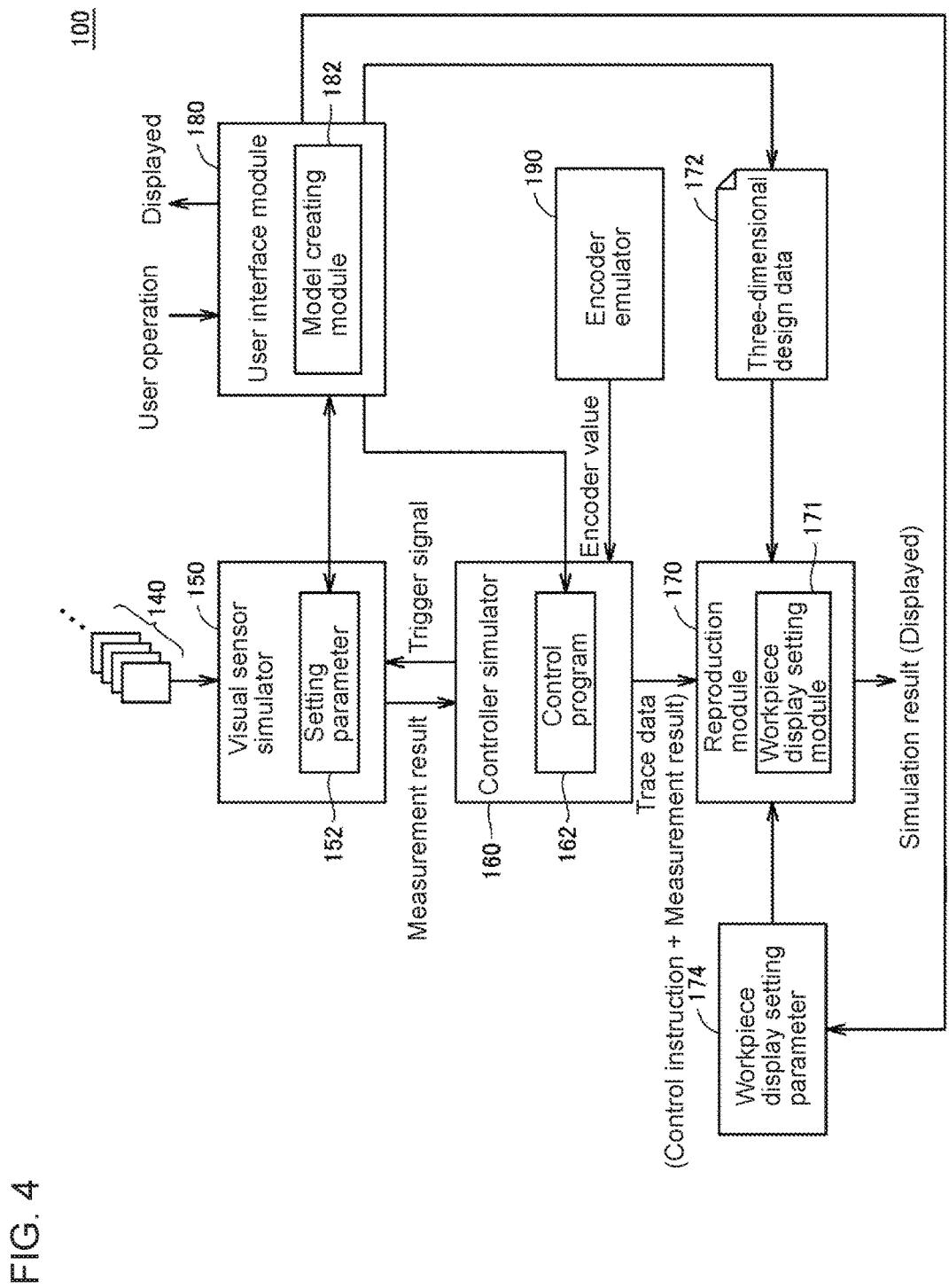
FIG. 4 is a schematic diagram showing the functional structure of the simulator according to the embodiment.

FIG. 4 is a schematic diagram showing the functional structure of the simulator 100 according to the present embodiment. The simulator 100 shown in FIG.

4 includes a visual sensor simulator 150, a controller simulator 160, a reproduction module 170, a user interface module 180, and an encoder emulator 190 as software functions. This group of functional modules is typically implemented by the processor 102 executing the simulation program 124 (refer to FIG. 3).

The user interface module 180 provides an operation screen for aiding the user to set and generate a setting parameter 152, a control program 162, three-dimensional design data 172, and a workpiece display setting parameter 174. The user interface module 180 also provides any user interface used when the reproduction module 170 displays simulation results.

The user interface module 180 includes a model creating module 182 for handling the three-dimensional design data 172. The model creating module 182 virtually creates the system to be simulated in a three-dimensional virtual space. More specifically, the model creating module 182 displays a three-dimensional virtual space, and provides a setting and operation screen for creating the system to be simulated in the three-dimensional virtual space.

The simulator 100 according to the present embodiment typically creates a system including a carrier (typically, a conveyor) virtually in a three-dimensional virtual space. As shown in FIG. 2, the system model includes the visual sensor 220 virtually located at a first position on a transporting path associated with the carrier (conveyor), and the controller 200 virtually located at a second position on the transporting path. The system model further includes an imaging area defined for the visual sensor. The system model intended for the pick-and-place operation as shown in FIGS. 1 and 2 may further define an area in which a workpiece is to be picked up (tracking area) and an area in which the workpiece is to be placed.

The visual sensor simulator 150 is a module for simulating the processing performed by the visual sensor 220, and performs image measurement of an input image including at least a part of a workpiece as a subject of the image in a manner associated with the imaging area predefined on the transporting path (conveyor) in the three-dimensional virtual space. More specifically, in response to a fetch instruction (typically, a trigger signal) from the controller simulator 160, the visual sensor simulator 150 retrieves the corresponding image data from the preliminarily obtained image data group 140, and performs the image measurement corresponding to the processing performed by the visual sensor 220 (refer to FIGS. 1 and 2). Typically, the image measurement performed by the visual sensor simulator 150 includes searching the input image for the part corresponding to one or more pieces of predetermined reference information.

The measurement results from the image measurement performed by the visual sensor simulator 150 are output to the controller simulator 160. The output processing corresponds to the transmission of the measurement results obtained by the visual sensor 220 to the controller 200 through the network 202 in the conveyor tracking system shown in FIGS. 1 and 2. The image measurement in the visual sensor simulator 150 is performed in accordance with a predetermined setting parameter 152.

The controller simulator 160 performs a control operation for generating a control instruction for a robot, which is an example of the processing device, based on the measurement results from the visual sensor simulator 150. The controller simulator 160 is a module for simulating the processing in the controller 200 (refer to FIGS. 1 and 2), and performs a control operation (a sequence instruction, a motion instruction, or various functional instructions) in accordance with the preliminarily created control program 162. Trace data including input and output associated with the control operation performed in the controller simulator 160 is output to the reproduction module 170 as trace data.

The trace data includes time-series data for the control instructions output from the controller simulator 160 to the robot and the measurement results from the visual sensor simulator 150.

The control operation performed in the controller simulator 160 includes processing for generating a fetch instruction (trigger signal) for retrieving image data, which is to be transmitted to the visual sensor simulator 150. More specifically, when a predetermined condition is satisfied, the controller simulator 160 generates a trigger signal. The predetermined condition is, for example, that the conveyor has moved by a predetermined distance, or a predetermined period has ended. As described later, the distance by which the conveyor has moved is determined based on information generated by the encoder emulator 190.

The reproduction module 170 reproduces, in the system, the behavior of the workpiece detected from the input image, together with the information about the type and the orientation of the workpiece, based on the trace data (including time-series data for a control instruction to be transmitted to the robot and the measurement results from the visual sensor simulator 150) output from the controller simulator 160. More specifically, the reproduction module 170 uses the three-dimensional design data 172, which is a definition file, to visualize the system virtually created in the three-dimensional virtual space, and also uses the trace data provided from the controller simulator 160 to reproduce the chronological changes of the workpiece and the robot in the system.

The reproduction module 170 includes a workpiece display setting module 171. The workpiece display setting module 171 refers to the workpiece display setting parameter 174 to determine the display mode of the workpiece to be reproduced. More specifically, the workpiece display setting module 171 sets and changes the color, shape, size, and orientation of the workpiece to appear in the three-dimensional virtual space in accordance with the workpiece display setting parameter 174. The information added to the workpiece to be reproduced will be described in detail later.

In this manner, the reproduction module 170 represents the chronological changes of the simulation results in the form of animation or a moving image on the display unit 108 of the simulator 100 (FIG. 3).

In the functional structure shown in FIG. 4, the controller simulator 160 outputs the time-series data for its output control instruction to the robot and also the trace data including the measurement results from the visual sensor simulator 150. However, the functional structure is not limited to this example. The reproduction module 170 may combine the time-series data with the trace data to reproduce the system behavior.

Figure 5:
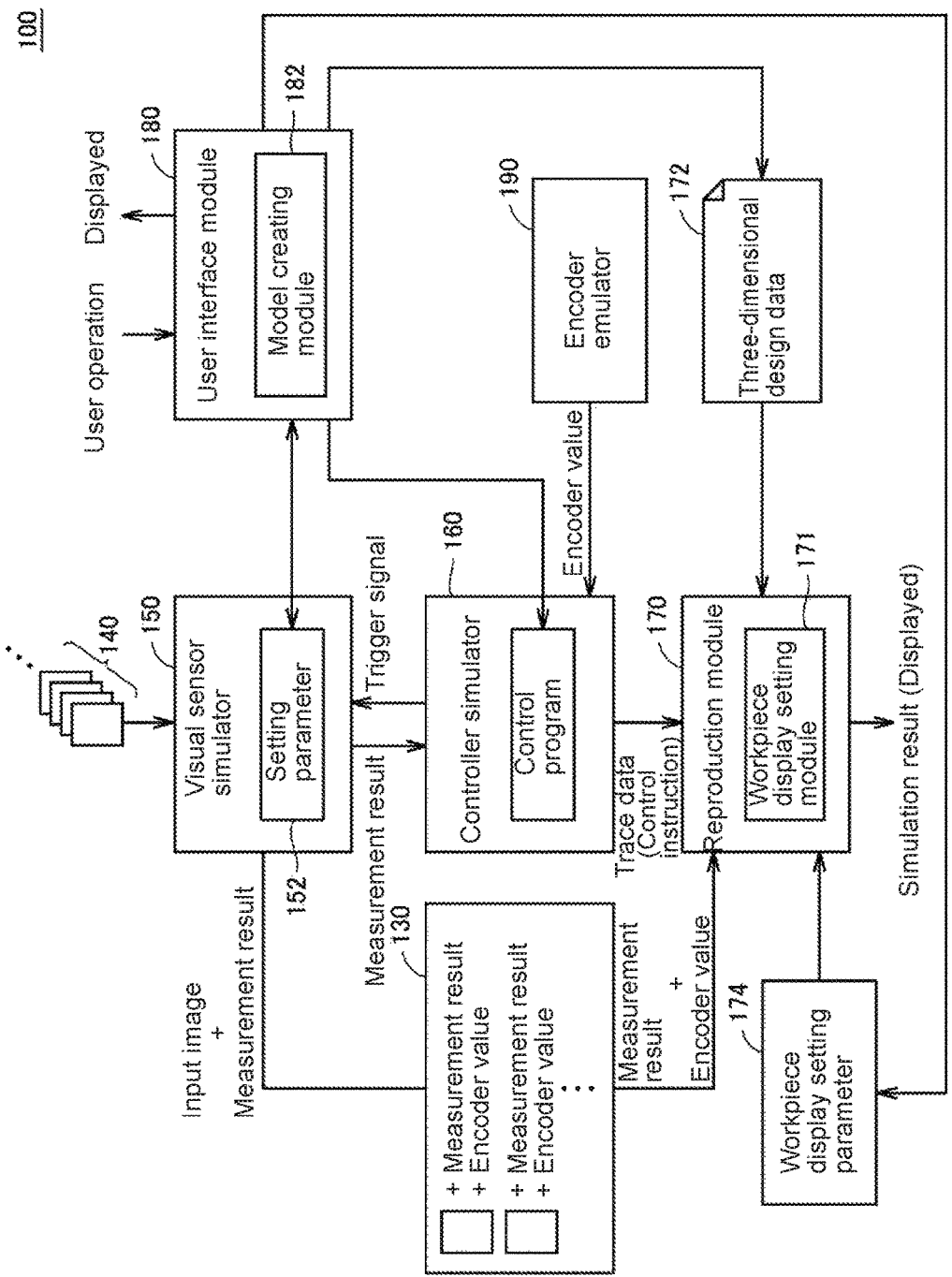
FIG. 5 is a schematic diagram showing the functional structure of the simulator according to a modification.

FIG. 5 is a schematic diagram showing the functional structure of the simulator 100 according to a modification of the present embodiment. The simulator 100 shown in FIG. 5 includes a measurement result storage unit 130 as a software function, in addition to the functional modules shown in FIG. 4. The measurement result storage unit 130 sequentially stores the measurement results from the image measurement performed by the visual sensor simulator 150 and the corresponding encoder values. In addition to the measurement results and the encoder values, the measurement result storage unit 130 may also store the input images that have undergone the image measurement.

The reproduction module 170 reproduces, in the three-dimensional virtual space, the chronological changes of the workpiece and the robot in the system by displaying the workpiece associated with the results from each image measurement stored in the measurement result storage unit 130 based on the corresponding encoder value.

With the functional structure shown in FIG. 5, for example, an input image that has undergone image measurement may also be displayed together with the reproduced behavior of the workpiece.

Although FIGS. 4 and 5 show the example in which the reproduction module 170 reproduces the behavior of the created system using the trace data output from the controller simulator 160, the simulator 100 may not include the reproduction module 170. For example, the trace data from the controller simulator 160 may be output to an external device or an external application, and the external device or the external application may reproduce the behavior of the system. In some embodiments, the reproduction module 170 may simply generate and store moving image data for reproducing the behavior of the system in any storage medium, which may then be reproduced by another application.

The encoder emulator 190 generates information indicating the position or displacement of the carrier in a manner associated with the movement of the carrier. In one example, the encoder emulator 190 may output the encoder value indicating a displacement from a reference position, or may generate pulses proportional to a movement of the carrier (conveyor) per unit time. In this case, the encoder value indicates the position of the conveyor, and the number of pulses per unit time indicates the speed of the conveyor.

D. Procedure

The procedure of simulation performed by the simulator 100 according to the present embodiment will now be described.

Figure 6:
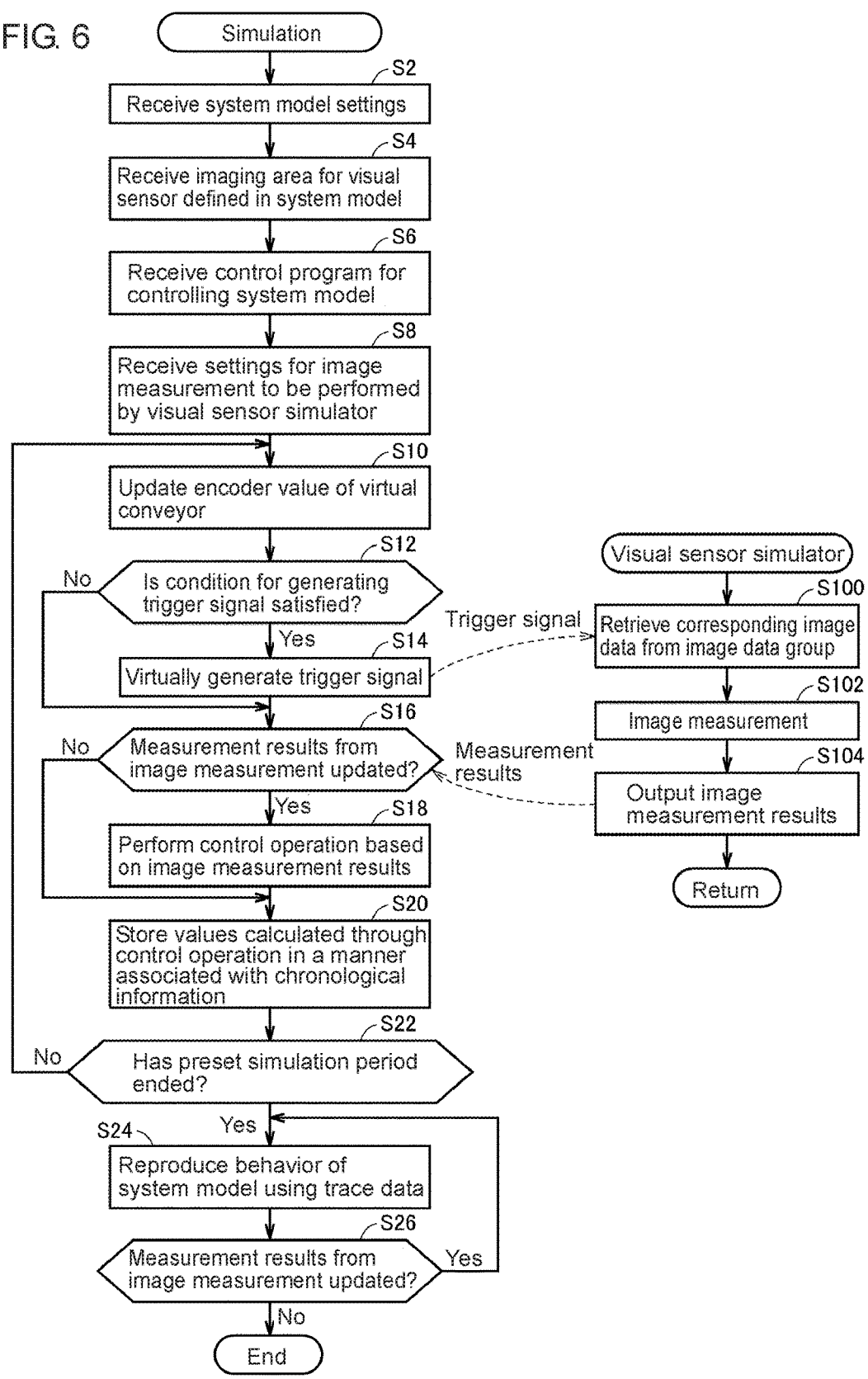
FIG. 6 is a flowchart showing the procedure of simulation performed by the simulator according to the embodiment.

FIG. 6 is a flowchart showing the procedure of simulation performed by the simulator 100 according to the present embodiment. With reference to FIG. 6, the simulator 100 first receives the settings of the system model (step S2). The settings of the system model include the arrangement of the devices included in the system, and the moving speed of the conveyor, which is a carrier. Based on these system model settings, the simulator 100 (model creating module 182) virtually creates a system to be simulated (system model) in a three-dimensional virtual space.

The simulator 100 (user interface module 180) receives an imaging area for a visual sensor defined in the system model (step S4). Based on the relative positional relationship between the created system and the defined imaging area, the simulator calculates a calibration parameter, which is a conversion parameter for transforming the measurement results into an input value for a control operation.

The simulator 100 (user interface module 180) then receives a control program for controlling the system model (step S6). The control program is associated with the system, and is to be executed by the controller simulator 160.

The simulator 100 (user interface module 180) receives the settings for image measurement to be performed by the visual sensor simulator 150 (step S8). The settings include designation of the processing details of the image measurement and reference information (e.g., a model image, and a feature quantity calculated from the model image) associated with the designated processing details.

This procedure completes the settings for the simulation.

When instructed to start the simulation, the simulator 100 (encoder emulator 190) updates an encoder value indicating the position or movement of a virtual conveyor at specified time intervals (step S10). The simulator 100 (controller simulator 160) determines whether a condition for generating a trigger signal is satisfied (step S12). When the condition is satisfied (Yes in step S12), the simulator 100 virtually generates a trigger signal (step S14). When the condition is not satisfied (No in step S12), the processing in step S14 is skipped.

In response to the generated trigger signal, the simulator 100 (visual sensor simulator 150) retrieves the corresponding image data from the preliminarily obtained image data group (step S100), and performs the image measurement (step S102). After the image measurement, the simulator 100 (visual sensor simulator 150) outputs the measurement results (step S104). The processing in steps S100 to S104 is performed independently of the processing performed in the controller simulator 160.

Subsequently, the simulator 100 (controller simulator 160) determines whether the measurement results from the image measurement have been updated (step S16). More specifically, the simulator 100 determines whether new measurement results have been received from the visual sensor simulator 150. When the measurement results have been updated (Yes in step S16), the simulator 100 (controller simulator 160) performs a control operation based on the updated measurement results (step S18). When the measurement results have not been updated (No in step S16), the processing in step S18 is skipped.

The simulator 100 (controller simulator 160) stores values calculated through the control operation in a manner associated with the corresponding encoder values, which are chronological information (step S20).

The simulator 100 determines whether a preset simulation period has ended (step S22). When the simulation period has not ended (No in step S22), the processing in step S10 and subsequent steps is repeated.

When the preset simulation period has ended (Yes in step S22), the simulator 100 reproduces the behavior of the system model using the trace data sequentially stored in step S20 (step S24).

When the setting of the workpiece display mode used to reproduce the behavior of the system model is changed in accordance with a user operation (Yes in step S26), the simulator 100 reproduces the behavior of the system model in the newly set workpiece display mode (step S24).

The simulator 100 can also change the time intervals and the update frequency of the behavior of the reproduced system model as appropriate in accordance with a user operation.

With the procedure described above, the processing capability (e.g., a tact time) and the accuracy of processing in the system model can be evaluated preliminarily.

E. Image Measurement

The image measurement to be performed in the simulator according to the present embodiment includes searching an input image for a part corresponding to one or more pieces of predetermined reference information. An example of such image measurement will now be described. The image measurement is not limited to this example, and may be any of various other examples of image measurement.

Figure 7A:
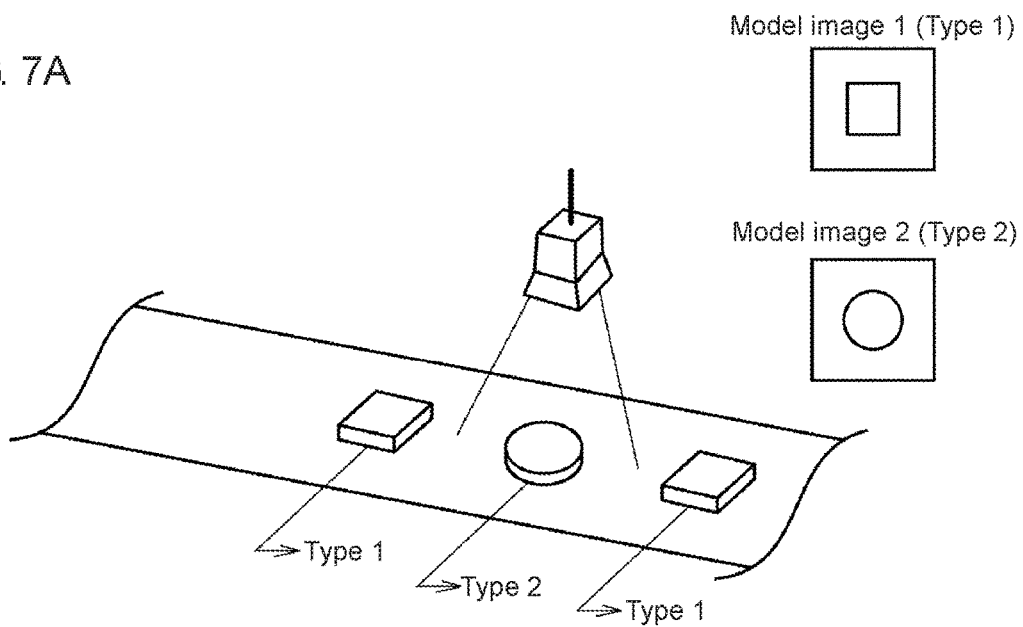
FIGS. 7A and 7B are schematic diagrams describing examples of image measurement performed by the simulator according to the embodiment.
Figure 7B:
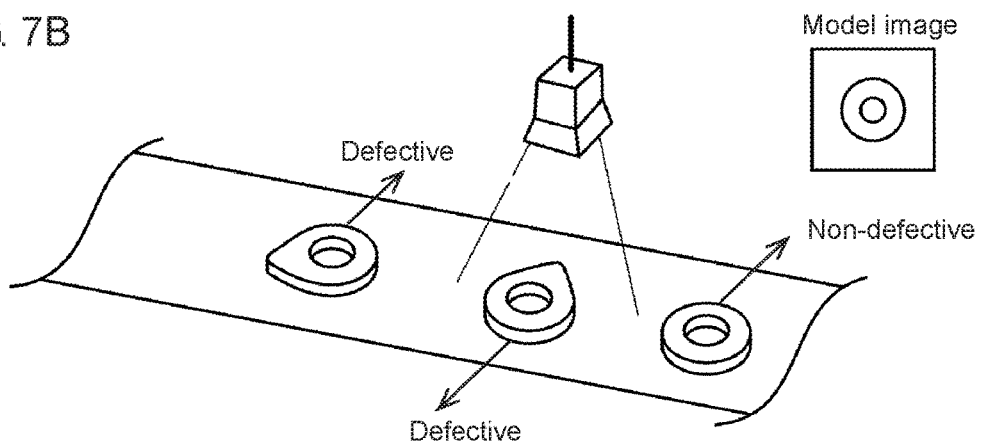

FIGS. 7A and 7B are schematic diagrams describing examples of the image measurement performed by the simulator 100 according to the present embodiment. FIG. 7A shows the processing suitable for determining the type of a workpiece, whereas FIG. 7B shows the processing suitable for determining the quality of a workpiece.

Referring now to FIG. 7A, for example, a plurality of model images captured by imaging workpieces to be detected are registered as predetermined reference information. The degrees of correspondence (typically, correlation values) between the preliminarily registered model images and the input images sequentially captured by imaging workpieces on a transporting path are calculated sequentially. Among the calculated correlation values between the input images and the model images, the correlation value that is the highest and exceeds a predetermined threshold is determined. The type of the workpiece is then determined based on the model image corresponding to the determined correlation value.

Thus, the workpiece type includes information indicating the most probable degree of correspondence with the workpiece among the predetermined model images (reference information). The reference information may be input images captured by imaging sample workpieces or feature images representing feature quantities (e.g., edge values) extracted from the input images.

This image measurement can be used to determine the type of each workpiece in a system for processing a mixture of different types of workpieces transported on a belt conveyor.

Referring now to FIG. 7B, for example, a model image captured by imaging a non-defective workpiece is registered as predetermined reference information. The degrees of correspondence (typically, correlation values) between the preliminarily registered model images and the input images sequentially captured by imaging workpieces on a transporting path are calculated. When each calculated correlation value with the model image exceeds a predetermined threshold, the target workpiece is determined to be non-defective. In any other cases, the target workpiece is determined to be defective.

Thus, the workpiece type includes information indicating whether the degree of correspondence between the workpiece and the predetermined model image (reference information) satisfies a predetermined condition. The reference information may be an input image captured by imaging a sample workpiece or a feature image representing a feature quantity (e.g., an edge value) extracted from the input image.

This image measurement can be used to determine whether each workpiece is non-defective or defective in a system involving a plurality of workpieces transported on a belt conveyor.

Figure 8:
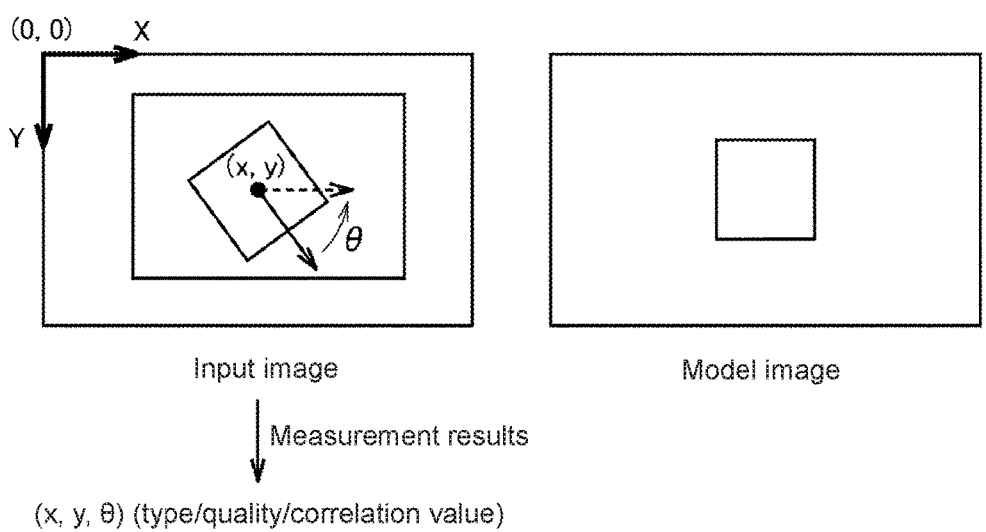
FIG. 8 is a schematic diagram describing the measurement results of the image measurement performed by the simulator according to the embodiment.

FIG. 8 is a schematic diagram describing the measurement results of the image measurement performed by the simulator 100 according to the present embodiment. FIG. 8 shows an example of pattern matching of an input image with a predetermined model image.

In FIG. 8, an object included in an input image is determined to correspond to its model image. The measurement results (x, y, θ) (type/quality/correlation value) are output. More specifically, the measurement results of the image measurement typically include (1) the coordinates (x, y) indicating the center of a part (object) detected in an input image, (2) the rotation angle θ of the detected part of the input image with respect to the model image, and (3) the type of the model image matching the part in the input image. The rotation angle θ is an angle by which an input image part corresponding to any model image (reference information) is rotated.

As described above, the type indicating the model image matching a workpiece may be replaced with information indicating whether the degree of correspondence with a particular model image satisfies a predetermined condition (or exceeds a threshold) (defective or non-defective), or a value indicating the degree of correspondence with a particular model image (correlation value).

The controller simulator 160 (refer to FIGS. 4 and 5) for simulating the processing in the controller 200 transforms the measurement results shown in FIG. 8 from the visual sensor simulator 150 (refer to FIGS. 4 and 5) for simulating the processing performed by the visual sensor 220 into the coordinates in a coordinate system of the system model, and then generates a control instruction. The controller simulator 160 also generates a control instruction for any processing based on the detected rotation angle of each workpiece (e.g., the processing for orienting each workpiece in the same direction).

F. Workpiece Display Position in Reproducing Simulation Results

The processing for calculating the position of a workpiece when the behavior of a system model is reproduced by the simulator 100 according to the present embodiment will now be described. More specifically, the simulator 100 (reproduction module 170) sequentially updates the display position of a workpiece in a three-dimensional virtual space based on information indicating the position or displacement of the conveyor transporting the workpiece.

As described with reference to FIG. 8, the measurement results of image measurement include the coordinates (x, y) indicating the center of a part (object) detected in the input image. The coordinates (x, y), which are values in a local coordinate system used for image measurement, are to be transformed into the coordinates in a three-dimensional virtual space.

More specifically, the simulator 100 can use transform coefficients A to F for transforming the coordinates (x, y) of an input image defined in the camera coordinate system used in image measurement into the coordinates (X, Y) defined in a world coordinate system defining the three-dimensional virtual space. The simulator 100 can thus calculate the initial display position at the time of input into the controller simulator 160 based on the workpiece coordinates (x, y) detected in the visual sensor simulator 150 in the manner described below.

Workpiece initial display position $X0 = A \times x + B \times y + C$

Workpiece initial display position $X0 = D \times x + E \times y + F$

A movement Xd of the conveyor in X-direction and a movement Yd of the conveyor in Y-direction per pulse of an encoder value can be used to calculate the workpiece display position corresponding to a displacement Et indicated by the encoder value as written in the formulas below.

Workpiece display position $(X) = Xd \times Et + X0$

Workpiece display position $(Y) = Yd \times Et + Y0$

When the absolute value of an encoder value is used, a deviation from the encoder value for each workpiece displayed initially may be incorporated in these formulas.

The simulator 100 sequentially updates the display position of each workpiece in accordance with these formulas.

G. Visualizing Simulation Results

The processing for visualizing the behavior of the system model performed by the simulator 100 according to the present embodiment will now be described. In the present embodiment, the behavior of a workpiece detected in image measurement is reproduced in the system model together with information about the type and the orientation of the workpiece.

Figure 9:
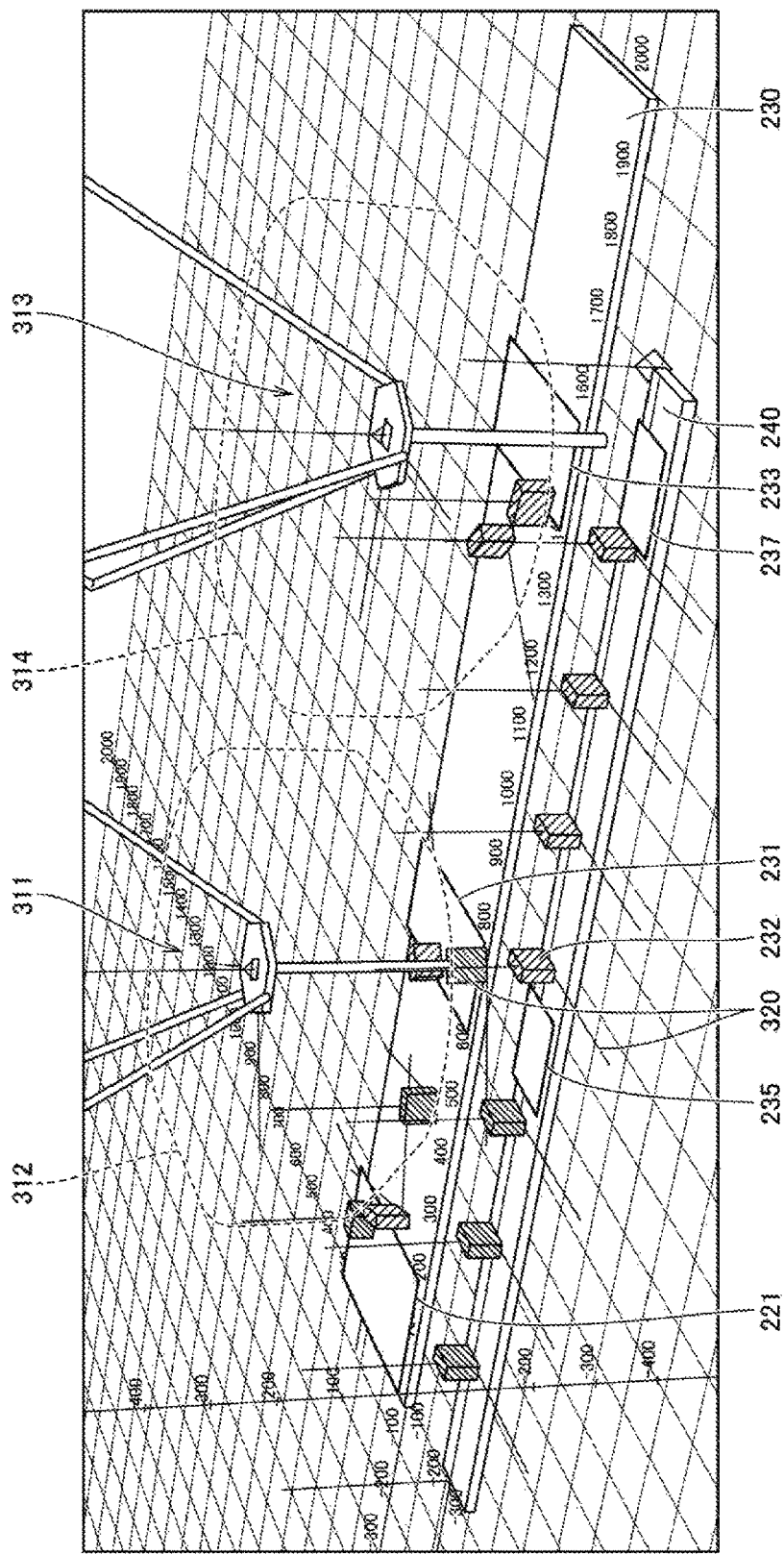
FIG. 9 is a diagram showing an example user interface screen for reproducing simulation results provided from the simulator according to the embodiment.

FIG. 9 is a diagram showing an example user interface screen for reproducing simulation results provided from the simulator 100 according to the present embodiment. In the user interface screen shown in FIG. 9, an object included in a three-dimensional virtual space can be rendered in any direction. More specifically, a user can freely change a point of view rendered in the user interface screen.

In the system model shown in FIG. 9, the conveyor 230 transporting a workpiece to be picked up and the conveyor 240 transporting a workpiece placed on it are arranged in parallel. The conveyors 230 and 240 are associated with two robots 311 and 313. In this system model, a workpiece 232 is transported by the conveyor 230 from left to right in the drawing. When the workpiece 232 reaches the predetermined tracking area 231 or 233, the robot 311 or 313 picks up the incoming workpiece 232 and places the workpiece on the conveyor 240. The robots 311 and 313 each place the workpiece 232 on the corresponding tracking area 235 or 237 defined on the conveyor 240. Each workpiece 232 placed in a random orientation on the conveyor 230 is aligned in a predetermined direction when placed on the conveyor 240.

In one example application, the conveyor 230 may transport at least two types of workpieces 232. The robot 311 is controlled to pick up and place one specific type of workpiece, whereas the robot 313 is controlled to pick up and place the other type of workpiece. The different types of workpieces may have different shapes. In this case, a robot having a special tool dedicated to a particular type of workpiece may be used for that type of workpiece.

Each workpiece 232 has information about the type and the orientation of the workpiece.

In the user interface screen shown in FIG. 9, the type of a workpiece 232 can be identified by the appearance color of the workpiece 232. More specifically, the appearance color of a workpiece 232 to be picked and placed by the robot 311 is different from that of a workpiece 232 to be picked and placed by the robot 313. As described above, the workpiece type may include the quality of the workpiece, in addition to the information indicating the model image matching the target workpiece. For example, a workpiece determined to be non-defective and a workpiece determined to be defective may have different appearance colors.

Additionally, the information about the orientation of the workpiece 232 includes two coordinate axes 320 indicating the rotation angle included in the measurement results. The coordinate axes 320 indicate the rotation angle of a workpiece 232 that has undergone image measurement, with respect to the origin of coordinates in the imaging area 221 defined in a part of the conveyor 230. More specifically, the rotation angle θ in FIG. 8 described above is transformed into values in a coordinate system defining the system model. These values correspond to local coordinates.

The use of the coordinate axes 320 representing the orientation of a workpiece 232 enables a user to determine whether the control program for controlling the robots is running correctly. Further, the coordinate axes 320 can indicate the orientation of a workpiece 232, which is expressed by a rotation by an angle of up to 360 degrees. This enables determination as to, for example, whether a cubic workpiece 232 has the same orientation as the model image (rotation angle=0 degrees) or has the reverse orientation (rotation angle=180 degrees).

The user interface screen shown in FIG. 9 may also display movement areas 312 and 314, in which the robots 311 and 313 can move, based on the design information for the two robots 311 and 313. The movement areas 312 and 314 can be used to preliminarily examine an optimum interval between the adjacent robots.

Additionally, the tracking areas 231 and 233 defined on the conveyor 230 and the tracking areas 235 and 237 defined on the conveyor 240 are also displayed. This further enables visual checking of the areas in which the robots 311 and 313 are movable (or the range within which a workpiece can be picked up and placed).

To reproduce the behavior of each workpiece on the user interface screen shown in FIG. 9, a workpiece is displayed at the timing when measured by the visual sensor simulator 150 (at the timing identified using an encoder value indicating the movement of the conveyor 230 during the simulation). The display position of the workpiece is subsequently updated as the encoder value is updated (incremented). For a workpiece picked up and placed on the conveyor 240 by the robot, its display position is sequentially updated based on the encoder value indicating the movement of the conveyor 240. When the value indicating the display position of the workpiece shows that the workpiece has moved out of the range of the conveyor 240, or in other words when the workpiece has reached the end of the conveyor 240, the workpiece disappears.

Although FIG. 9 shows the user interface screen in one example for reproducing the simulation according to the present embodiment, the information about the type and the orientation of a workpiece may appear in any display mode and may be set with any method as described below.

g1: Display Mode for Workpiece Type

The simulator 100 (reproduction module 170) according to the present embodiment displays each type of workpiece with at least one of a different color, a different shape, or a different size. In the display modes shown in FIG. 9, different workpiece types are distinguished by different colors. In some embodiments, objects as workpieces may have different shapes depending on their types, instead of or in addition to having different colors.

Figure 10A:
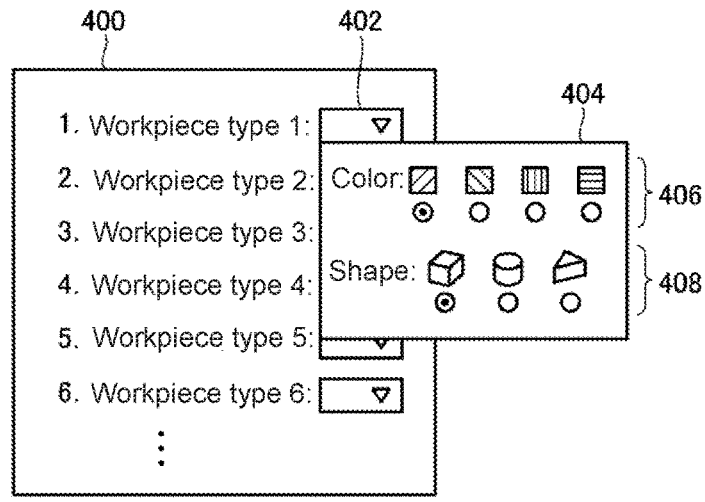
FIGS. 10A and 10B are schematic diagrams describing an example of user setting for the display mode of simulation results provided from the simulator according to the embodiment.
Figure 10B:
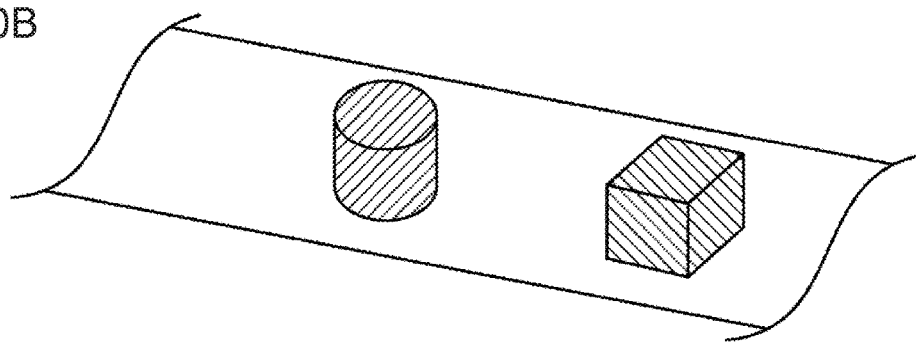

FIGS. 10A and 10B are schematic diagrams describing an example of user setting for the display mode of simulation results provided from the simulator 100 according to the present embodiment. For example, FIG. 10A shows a setting screen 400, which allows the user to set any workpiece display mode used for reproducing the simulation results. Thus, the simulator 100 may have the user interface module 180 (input unit) for receiving the setting of at least one of the color, shape, and size used for displaying each type of workpiece.

The setting screen 400 includes a pull-down list 402, which is used to select the display mode of each workpiece type. When an entry in the pull-down list 402 is selected, the corresponding pull-down menu 404 appears.

The pull-down menu 404 includes a color choice area 406 for choosing the color of target workpieces and a shape choice area 408 for choosing the shape of the target workpieces. The user chooses one of the colors listed in the color choice area 406 and one of the shapes listed in the shape choice area 408. In this manner, the user can choose the color and the shape for each type of workpiece, for which the behavior is to be reproduced.

After the color and the shape are designated in this manner, the simulation results are reproduced in the display mode shown in FIG. 10B.

Figure 11:
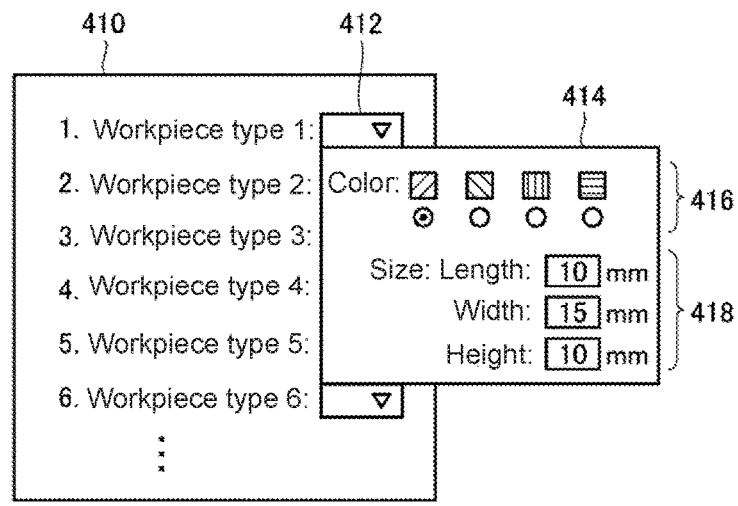
FIG. 11 is a schematic diagram describing another example of user setting for the display mode of simulation results provided from the simulator according to the embodiment.

In some embodiments, the user may freely set the sizes of workpieces. FIG. 11 is a schematic diagram describing another example of user setting for the display mode of simulation results provided from the simulator 100 according to the present embodiment. For example, FIG. 11 shows a setting screen 410, on which the user selects an entry in a pull-down list 412 to display the corresponding pull-down menu 414.

The pull-down menu 414 includes a color choice area 416 for choosing the color of target workpieces and a size entry area 418 for setting the dimensions (length, width, and height) of target workpieces. The user chooses one of the colors listed in the color choice area 416, and sets the dimensions of workpieces to be displayed in the size entry area 418.

In the size entry area 418, the actual dimensions of workpieces may be entered directly. In this case, the system model virtually created in a three-dimensional space is also associated with its actual dimensions, and thus the workpieces are represented with the corresponding dimensions in accordance with a conversion parameter calculated from the dimensions of the system model.

The dimensions of workpieces may be freely set in this manner. Thus, the user can check the simulation results nearer the reality in accordance with the application to be simulated.

Figure 12:
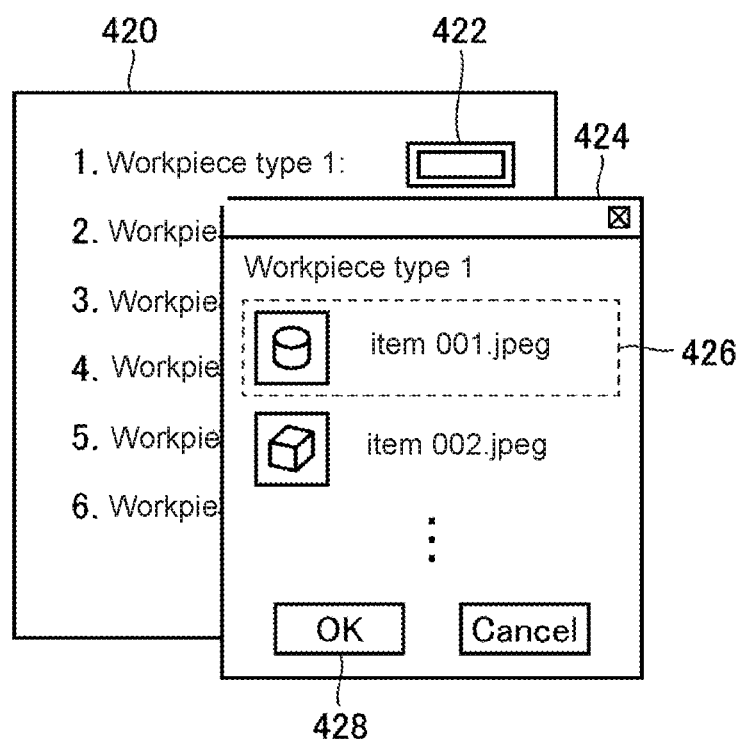
FIG. 12 is a schematic diagram describing another example of user setting for the display mode of simulation results provided from the simulator according to the embodiment.

Additionally, the user may freely set an image used for reproducing workpieces. FIG. 12 is a schematic diagram describing another example of user setting for the display mode of simulation results provided from the simulator 100 according to the present embodiment. FIG. 12 shows a setting screen 420, on which the user selects a setting button 422 to display the corresponding image selection menu 424.

The image selection menu 424 lists images used for displaying target workpieces, together with the corresponding file names 426. The user chooses an image file from the listed file names 426. When the user selects an OK button 428, the selected image file is activated. As a result, the workpieces of different types are reproduced using the corresponding images included in the designated image file.

An image used for displaying workpieces may be freely set in this manner. Thus, the user can check the simulation results nearer the reality in accordance with the application to be simulated.

The simulation results may be reproduced in a mode to allow the user to readily determine the type indicated by the type information assigned to each workpiece.

Figure 13A:
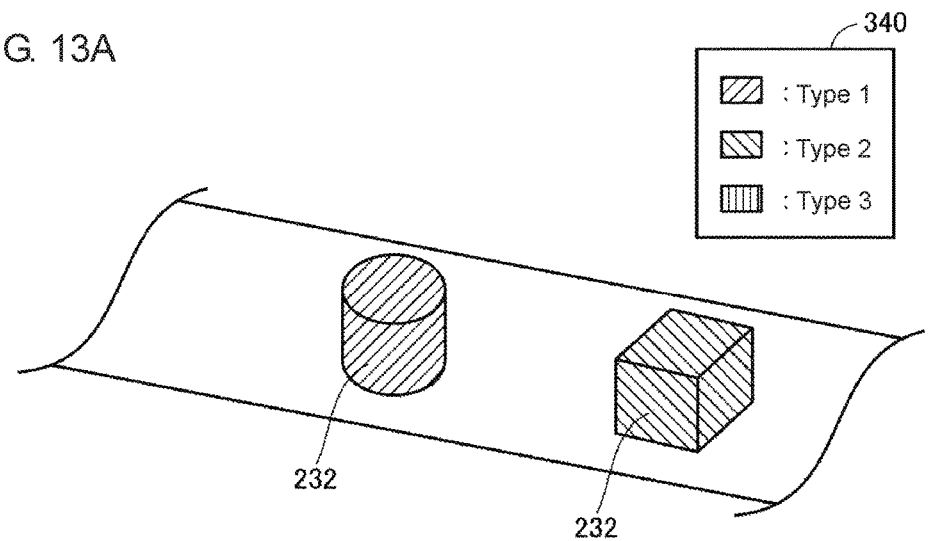
FIGS. 13A and 13B are diagrams each showing an example user interface screen for supporting determination of each workpiece type based on simulation results provided from the simulator according to the embodiment.
Figure 13B:
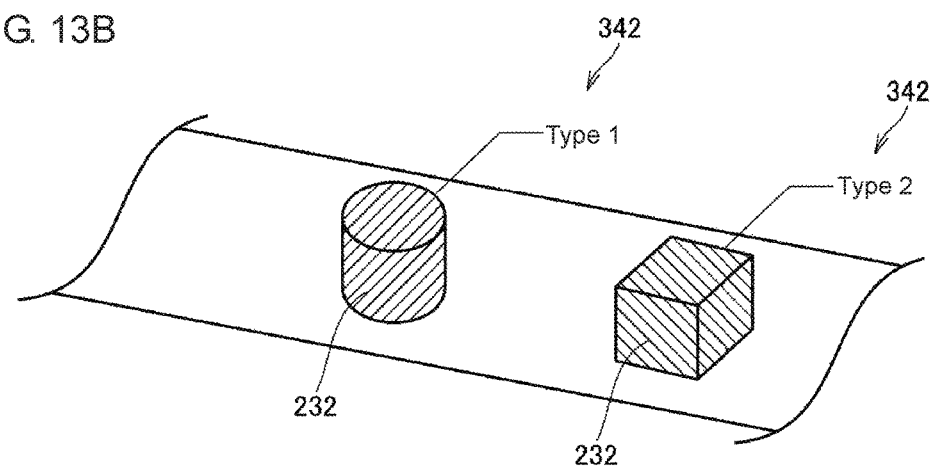

FIGS. 13A and 13B are diagrams each showing an example user interface screen for supporting determination of each workpiece type based on simulation results provided from the simulator 100 according to the present embodiment.

The user interface screen shown in FIG. 13A shows workpieces 232 and a legend 340 specifying the workpiece types corresponding to the colors of the workpieces 232. The user can refer to the correspondence indicated by the legend 340 and readily determine the type of each workpiece 232.

The user interface screen shown in FIG. 13B shows a label 342 associated with each workpiece 232, such as Type 1 and Type 2. The user can refer to each label 342 and readily determine the type of each workpiece 232.

The workpiece displays are not limited to the examples shown in FIGS. 13A and 13B. Any support display may be used to allow the user to readily determine the type of each workpiece. The display examples described above may also be combined as appropriate.

g2: Display Mode of Workpiece Orientation

The simulator 100 (reproduction module 170) according to the present embodiment generates information about the orientation of a workpiece based on the rotation angle included in the measurement results. Although FIG. 9 is a diagram showing the display mode showing the orientation of a workpiece using the two coordinate axes 320 as objects, any other display mode may be used.

Figure 14A:
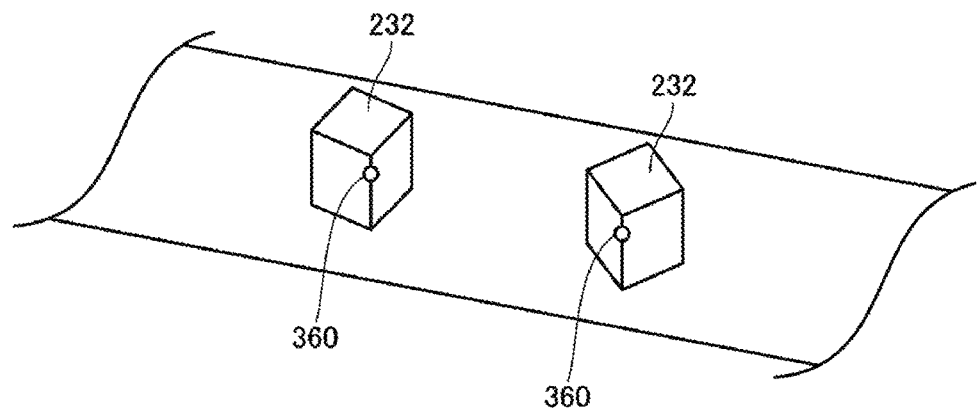
FIGS. 14A and 14B are diagrams each showing an example display of workpiece orientations based on simulation results provided from the simulator according to the embodiment.
Figure 14B:
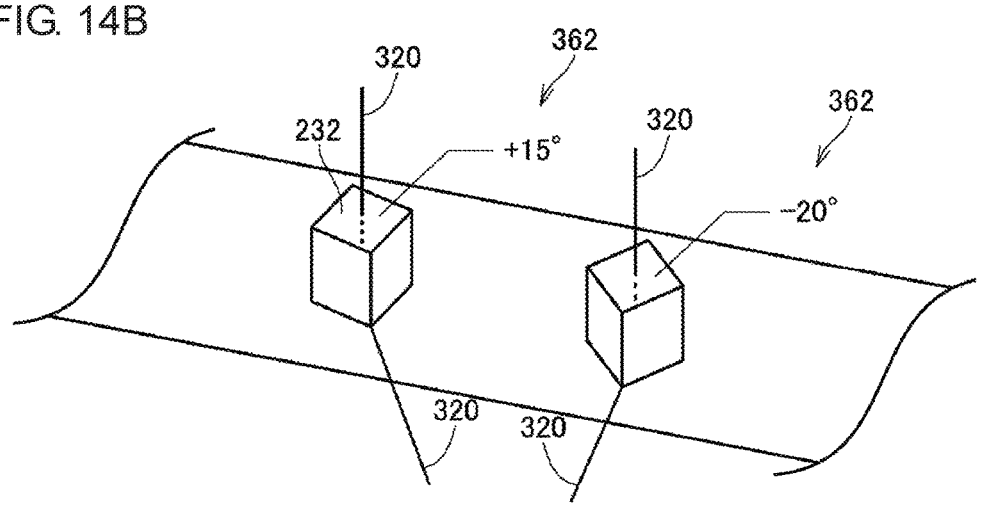

FIGS. 14A and 14B are diagrams each showing an example display of workpiece orientations based on simulation results provided from the simulator 100 according to the present embodiment.

The display example shown in FIG. 14A shows marks 360 on workpieces 232. Each mark 360 represents a reference direction. The reference direction may be, for example, the direction with the rotation angle of 0 degrees with respect to the corresponding model image. Referring to FIG. 8, the reference direction is determined to be the same direction as set for a predetermined model image. A mark 360 is assigned to a part of a workpiece 232 oriented in the reference direction. The mark 360 thus allows the user to readily determine the orientation of each workpiece 232.

The display example shown in FIG. 14B includes the coordinate axes 320 as well as labels 362 indicating the rotation angles of workpieces 232. Each label 362 indicates the angle of a direction in which the corresponding workpiece 232 is oriented. Although both the coordinate axes 320 and the labels 362 are shown in the display example in FIG. 14B, only the labels 362 may be displayed.

In this manner, objects indicating the orientations of workpieces (coordinate axes 320, marks 360, or labels 362) may be displayed together with the workpieces.

Figure 15A:
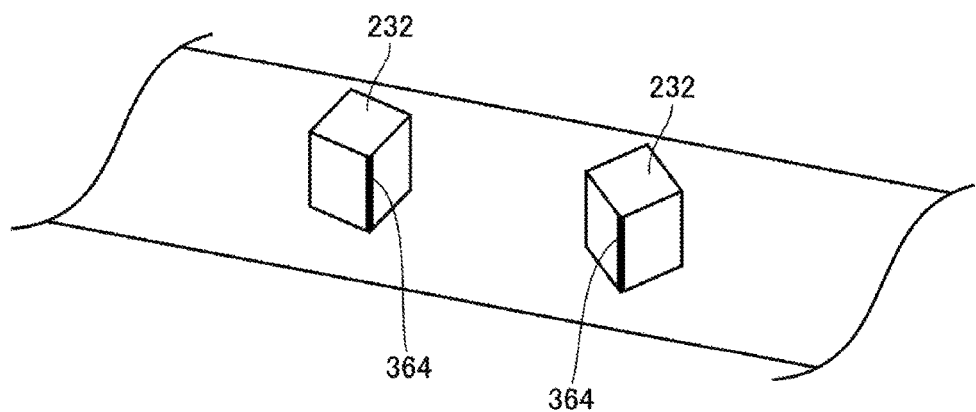
FIGS. 15A and 15B are diagrams each showing another example display of workpiece orientations based on simulation results provided from the simulator according to the embodiment.
Figure 15B:
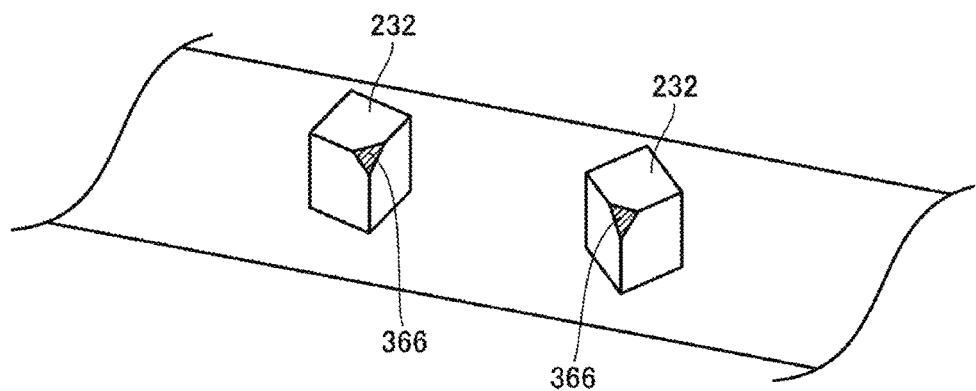

In some embodiments, the shape of a workpiece used for display may be associated with the orientation of the workpiece. FIGS. 15A and 15B are diagrams each showing another example display of workpiece orientations based on simulation results provided from the simulator 100 according to the present embodiment.

In the display example shown in FIG. 15A, an area of a workpiece 232 corresponding to a reference direction has a display mode different from that of the other area. More specifically, an area 364 of each workpiece 232 corresponding to a reference direction (one side of each prism in the display example shown in FIG. 15A) has a color different from the color of the other area. This display including the area 364 allows the user to readily determine the direction in which each workpiece 232 is oriented.

In FIG. 15A, the display mode of one side of each prism differs from that of the other area. However, the display is not limited to this example. For example, a particular surface of a prism may have a display mode different from that of the other area.

In the display example shown in FIG. 15B, an area of a workpiece 232 corresponding to a reference direction has a shape different from the shape of the other area. More specifically, an area 366 of each workpiece 232 corresponding to a reference direction (an edge of each prism in the display example shown in FIG. 15B) is chamfered. The shape of the area 366 allows the user to readily determine the direction in which each workpiece 232 is oriented. Additionally, the chamfered edge of the area 366 may have a color different from the color of the other area.

In this manner, a feature (area 364 or 366) may be added to the appearance of a reproduced workpiece in a manner associated with the orientation of the workpiece.

The display mode is not limited to the examples shown in FIGS. 14 and 15, and any display mode may be used to allow the user to readily determine the orientation of a workpiece. The display examples described above may also be combined as appropriate.

g3: Additional Objects

Although the display modes of the workpieces detected in input images through image measurement have been described, not only workpieces but also additional objects may be displayed to allow more accurate simulation near an actual application. In the example described below, the simulation results with additional objects are reproduced.

For example, the pick-and-place operation has applications including placement of one or more workpieces into a case, such as packing. A box in which the workpieces are packed may also be displayed in a three-dimensional virtual space. The box is also transported on a conveyor, and thus this behavior can be visualized to perform preliminarily evaluation to determine whether the conveyor and the robots operate as designed.

Figure 16:
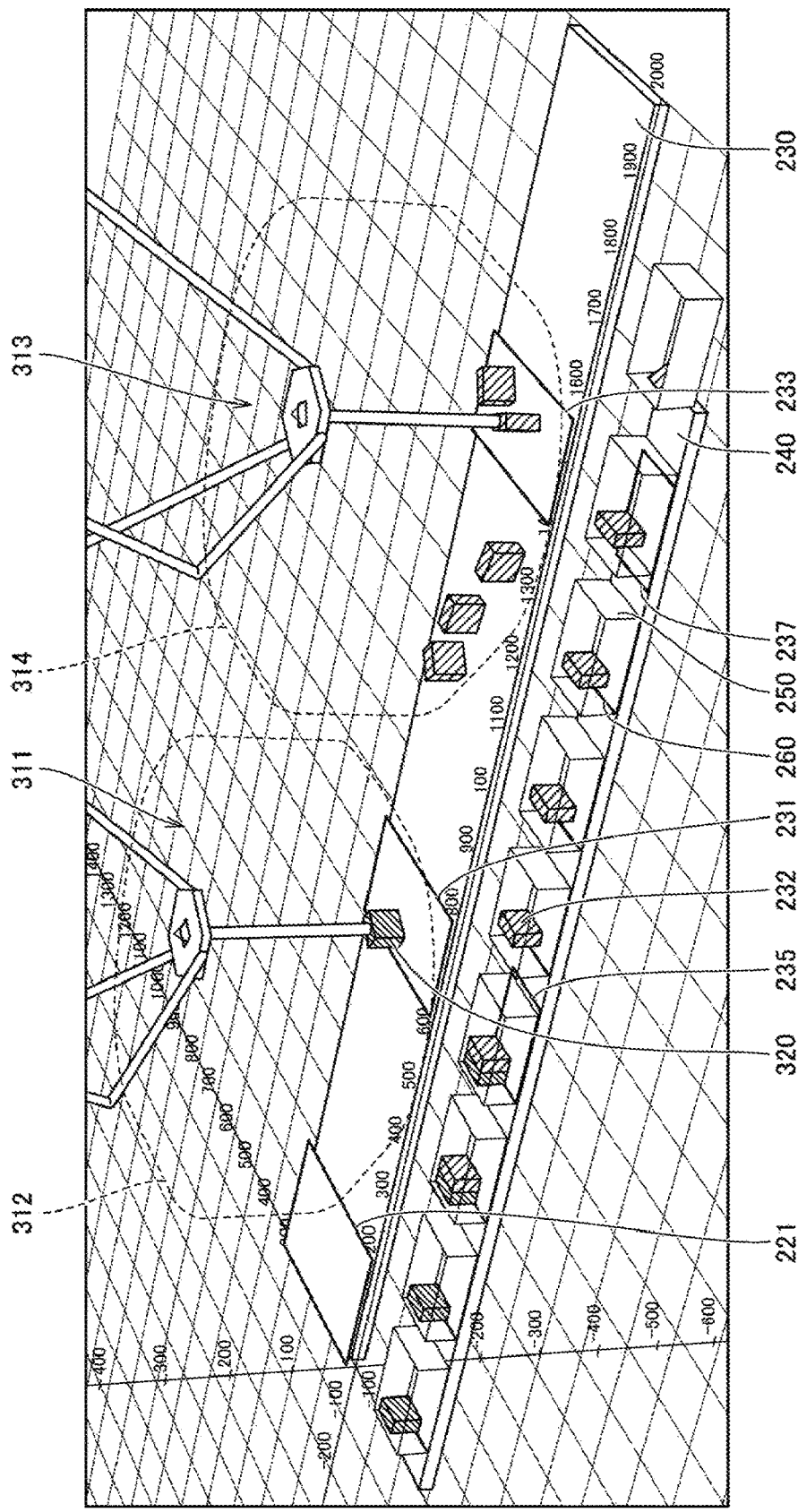
FIG. 16 is a diagram showing another example user interface screen for reproducing simulation results provided from the simulator according to the embodiment.

FIG. 16 is a diagram showing another example user interface screen for reproducing simulation results provided from the simulator 100 according to the present embodiment. With reference to FIG. 16, multiple reference lines 260 are displayed on the conveyor 240 at intervals preset by the user. The intervals between the displayed reference lines 260 are, for example, preset based on required specifications (including a tact time). When simulation results are reproduced, the reference lines 260 appear on the conveyor 240 at the preset intervals.

For example, the reference lines 260 may serve as references to define areas in which workpieces are to be placed by the pick-and-place operation. The user can evaluate whether the workpieces 232 on the conveyor 240 are accurately placed at positions indicated by the reference lines 260.

Objects 250 indicating boxes used in an actual application may also be displayed instead of or in addition to the reference lines 260. The display positions of and the display intervals between the objects 250 may also be preset by the user in the same manner as for the reference lines 260. Further, the shape of the objects 250 may also be preliminarily and freely set by the user. In the same manner as for the appearance of workpieces set as described with reference to FIGS. 10 to 12, the shape, color, and size of the objects 250 may be set freely. The objects 250 may be transparent or semitransparent to allow the user to readily check the positional relationship between the objects 250 and the workpieces 232.

As shown in FIG. 16, the additional objects 250 and/or the reference lines 260 are virtually displayed in addition to the workpieces 232 to allow visual evaluation to determine whether the workpieces are processed as designed.

H. Modification

Although the above embodiment illustrates a typical example in which targets are transported on a transporting path, the embodiment is applicable to another system as described below.

For example, when workpieces undergo multiple processes, multiple robots installed in a line may cooperate with each another to implement an intended operation, or humans and robots may cooperate with each other to implement an intended operation. To transfer a workpiece between processes in such an arrangement, a common work area is provided between a robot or a human in an upstream process and a robot in a downstream process. The common work area has the function of simply buffering a workpiece, instead of using a carrier such as a conveyor. A system with an imaging area for a visual sensor defined in such a common work area can be virtually created in a three-dimensional virtual space with the procedure described in the above embodiment. This allows visual evaluation to determine whether workpieces are processed as designed in the system.

I. Advantages

The simulator 100 according to the present embodiment allows evaluation of the behavior of the overall system for processing workpieces by checking both the positions and the orientations of the workpieces that are processed by the processing device such as robots in accordance with a control instruction. This structure allows the validity of the system under examination to be determined readily.

The embodiments disclosed herein should be considered to be in all respects illustrative and not restrictive. The scope of the present invention is determined not by the description given above but by the claims, and is construed as including any modification that comes within the meaning and range of equivalency of the claims.

REFERENCE SIGNS LIST 1, 2 conveyor tracking system
100 simulator
102 processor
104 main memory
106 input unit
108 display unit
110 network interface
112 optical drive
114 optical disc
116 communication interface
118 internal bus
120 hard disk drive
122 OS
124 simulation program
130 measurement result storage unit
140 image data group
150 visual sensor simulator
152 setting parameter
160 controller simulator
162 control program
170 reproduction module
171 workpiece display setting module
172 three-dimensional design data
174 workpiece display setting parameter
180 user interface module
182 model creating module
190 encoder emulator
200 controller
202 network
210, 311, 313 robot
220 visual sensor
221 imaging area
222 imaging unit
230, 240 conveyor
231, 233, 235 tracking area
232 workpiece
234, 244 drive roller
236, 246 encoder
250 object
260 reference line
400, 410, 420 setting screen
402, 412 pull-down list
404, 414 pull-down menu
406, 416 color choice area
408 shape choice area
418 size entry area
422 setting button
424 image selection menu

The invention claimed is:

1. A simulator for estimating a behavior of a system comprising a processing device for processing a target, the simulator comprising a processor configured with a program to perform operations comprising:
operation as a creating unit configured to virtually create the system in a three-dimensional virtual space;
operation as a measurement unit configured to perform image measurement of an input image comprising at least a part of the target, the input image associated with a first area predefined at a predetermined position in the three-dimensional virtual space, the image measurement comprising searching the input image for a part corresponding to one or more pieces of predetermined reference information;
operation as an execution unit configured to execute a control operation for generating a control instruction directed to the processing device based on a measurement result obtained by the measurement unit, the measurement result comprising a type of the target and a quality of the target; and
operation as a reproduction unit configured to reproduce, in the virtually created system, a behavior of the target based on time-series data for the control instruction, the measurement result, and an orientation of the detected target.

2. The simulator according to claim 1, wherein
the type of the target comprises information indicating a piece of reference information having a most probable degree of correspondence with the target.

3. The simulator according to claim 1, wherein
the type of the target comprises information indicating whether a degree of correspondence between the target and the pieces of predetermined reference information satisfies a predetermined condition.

4. The simulator according to claim 1, wherein
the processor is configured with the program such that operation as the reproduction unit comprises operation as the reproduction unit that displays the target using at least one of: a color; a shape; or a size that differ depending on the type of the target.

5. The simulator according to claim 4, wherein the processor is configured with the program to perform operations further comprising operation as an input unit configured to receive a setting of at least one of the color, the shape, or the size that differ depending on the type of the target.

6. The simulator according to claim 1, wherein the processor is configured with the program such that:
operation as the measurement unit comprises operation as the measurement unit that outputs the measurement result comprising a rotation angle of the part corresponding to one or more pieces of predetermined reference information included in the input image; and
operation as the reproduction unit comprises operation as the reproduction unit that generates information about the orientation of the target based on the rotation angle output as the measurement result.

7. The simulator according to claim 1, wherein the processor is configured with the program such that operation as the reproduction unit comprises operation as the reproduction unit that displays, in addition to the target, an object indicating the orientation of the target.

8. The simulator according to claim 1, wherein the processor is configured with the program such that operation as the reproduction unit comprises operation as the reproduction unit that displays a feature added to an appearance of the reproduced target with the orientation of the target.

9. The simulator according to claim 1, wherein
the system further comprises a carrier configured to transport the target, and
the predetermined position at which the first area is predefined comprises a transporting path of the carrier.

10. The simulator according to claim 9, wherein the processor is configured with the program such that operation as the reproduction unit comprises operation as the reproduction unit that sequentially updates a display position of the target in the three-dimensional virtual space based on information indicating a position or a displacement of the carrier that transports the target.

11. A simulation method implemented by a computer for estimating a behavior of a system comprising a processing device for processing a target, the method comprising:
virtually creating the system in a three-dimensional virtual space;

performing image measurement of an input image comprising at least a part of the target, the input image associated with a first area predefined at a predetermined position in the three-dimensional virtual space, the image measurement comprising searching the input image for a part corresponding to one or more pieces of predetermined reference information;

executing a control operation for generating a control instruction directed to the processing device based on a measurement result from the image measurement, the measurement result comprising a type of the target and a quality of the target; and reproducing, in the virtually created system, a behavior of the target based on time-series data for the control instruction, the measurement result, and an orientation of the detected target.

12. A non-transitory computer-readable medium storing a simulation program for estimating a behavior of a system comprising a processing device for processing a target, the simulation program causing a computer to implement:

virtually creating the system in a three-dimensional virtual space;

performing image measurement of an input image comprising at least a part of the target, the input image associated with a first area predefined at a predetermined position in the three-dimensional virtual space, the image measurement comprising searching the input image for a part corresponding to one or more pieces of predetermined reference information;

executing a control operation for generating a control instruction directed to the processing device based on a measurement result from the image measurement, the measurement result comprising a type of the target and a quality of the target; and reproducing, in the virtually created system, a behavior of the target based on time-series data for the control instruction, the measurement result, and an orientation of the detected target.

13. The simulation method according to claim 11, wherein the type of the target comprises information indicating a piece of reference information having a most probable degree of correspondence with the target.

14. The simulation method according to claim 11, wherein the type of the target comprises information indicating whether a degree of correspondence between the target and the pieces of predetermined reference information satisfies a predetermined condition.

15. The simulation method according to claim 11, wherein reproducing, in the virtually created system, a behavior of the target further comprises displaying the target using at least one of: a color; a shape; or a size that differ depending on the type of the target.

16. The simulation method according to claim 15, further comprising receiving a setting of at least one of the color, the shape, or the size that differ depending on the type of the target.

17. The simulation method according to claim 11, further comprising:

outputting the measurement result comprising a rotation angle of the part corresponding to one or more pieces of predetermined reference information included in the input image, wherein reproducing, in the virtually created system, a behavior of the target further comprises generating information about the orientation of the target based on the rotation angle output as the measurement result.

18. The simulation method according to claim 11, wherein reproducing, in the virtually created system, a behavior of the target further comprises displaying, in addition to the target, an object indicating the orientation of the target.

19. The simulation method according to claim 11, reproducing, in the virtually created system, a behavior of the target further comprises displaying a feature added to an appearance of the reproduced target associated with the orientation of the target.

20. The simulation method according to claim 11, wherein
the system further comprises a carrier configured to transport the target, and
the predetermined position at which the first area is predefined comprises a transporting path of the carrier.

* * * * *